United States Patent [19]

Carlsen, II

[11] 4,234,805
[45] Nov. 18, 1980

[54] CIRCUIT AND METHOD FOR PARALLELING POWER TRANSISTORS

[75] Inventor: George D. Carlsen, II, Culver City, Calif.

[73] Assignee: EVC, Inc., Inglewood, Calif.

[21] Appl. No.: 886,716

[22] Filed: Mar. 15, 1978

[51] Int. Cl.³ .................... H03K 17/60; H03K 3/26
[52] U.S. Cl. .................... 307/254; 307/300; 307/315; 307/270
[58] Field of Search ............ 307/300, 315, 270, 254; 357/46

[56] References Cited

U.S. PATENT DOCUMENTS

| | | | |
|---|---|---|---|
| 3,831,102 | 8/1974 | Medal | 307/300 |
| 4,100,564 | 7/1978 | Sasayama | 357/46 |
| 4,128,742 | 12/1978 | Davis | 307/315 |

Primary Examiner—Stanley D. Miller, Jr.
Assistant Examiner—B. P. Davis
Attorney, Agent, or Firm—Jessup & Beecher

[57] ABSTRACT

A circuit and method of paralleling power transistors connected as a Darlington circuit or device for use with electric motor controls. The circuit is comprised of a plurality of Darlington devices having a drive circuit from a motor controller connected to a common base connection and a plurality of active pull-down circuits for reducing the rise and fall times and effectively controlling the storage times of the power transistors. The active pull-down circuits are capacity coupled to an inverted drive signal to synchronize the turn-off time and speed-up discharge of storage in the power transistor circuit.

11 Claims, 3 Drawing Figures

CIRCUIT AND METHOD FOR PARALLELING POWER TRANSISTORS

BACKGROUND OF THE INVENTION

This invention relates generally to parallel connection of power transistors, and more particularly relates to the parallel connection of Darlington devices.

For circuits which must handle extremely high power, it is natural to look toward parallel operation of power transistors. This would seem to be a completely straightforward solution to the problem with the power handling capacity increased by parallel connected power transistors. A difficulty with the solution, however, is the fact that transistors of the same type do not always have identical characteristics. Therefore, unless proper precautions are taken, transistors in parallel will not accept equal portions of the load, resulting in damage or even destruction of the circuit. Unsatisfactory solutions to this problem are the use of balancing resistors or the attempted use of matched transistors.

There are a number of methods available for the paralleling of power transistors. One method is to connect the parallel transistors with common collectors and common emitter connections but with separate base drive circuits. This is generally not used, however, because of poor load sharing. Some other acceptable methods are by using separate base drive circuits and balance resistors in the collector or emitter circuits. Another method is the use of the balance resistor in the emitter with a common base connection. The latter three types of circuits are most often used, but the extra resistor power dissipation is a major disadvantage which must be tolerated. However, in the case of a 200-amp Darlington device, this extra resistor dissipation cannot be tolerated because of the high powers involved.

Further, since the successful production of high amperage, compound or Darlington devices, (sometimes referred to as a Darlington transistor or pair) the need for higher current controllers of similar efficiency become evident.

Generally it has not been thought possible to connect Darlington power transistors in parallel, because of differences in the storage time which could result in destruction of one or the pair of power devices. That is, if the storage time of one Darlington device is greater than that of the other Darlington device connected in parallel, then at turn-off the former would carry a full load which could destroy the power device.

Preliminary investigation showed that a degree of static current sharing existed with parallel Darlington devices by virtue of the collector-emitted voltage of each device being proportional to collector current and inversely proportional to heating effect. It was determined that inherent static current sharing capabilities of the Darlington devices was not a serious problem and that the principal problem was the dynamic current sharing with the inductive motor loads.

The static current sharing phenomenon takes place throughout turn-on and full current operation, while the dynamic current sharing problem occurs at turn-off, where in the worst case one Darlington device could momentarily have to handle the entire load. One method for solution to the dynamic current sharing at turn-on would be to place equalizing inductors with individual flyback diodes in the collector circuit of each parallel transistor. However, such inductors are necessarily bulky and add to the cost of the unit, as well as lowering electric vehicle control efficiency through added copper losses.

SUMMARY OF THE INVENTION

The purpose of the present invention is to permit parallel connection of Darlington devices for very high current switching for use with electric motor transistor current controls.

Power transistors connected in a Darlington circuit configuration with direct paralleling of all transistor elements eliminates the need for balance resistors and makes construction simple and makes drive and load circuits less complex. However, differences in rise and fall times of the transistors in parallel operation can seriously affect their performance. For example, if two power transistors have widely different rise and fall times, the transistor with the fastest rise time must take the full load alone at turn-on and in like manner the transistor with the longest fall time must take the full load when its faster partner turns off first. Typical turn-on and turn-off rise and fall times with differences of about thirty to fifty nonoseconds are not a serious problem and are usually so small they can be ignored.

However, storage time, which is the time required after base drive is removed from the saturated transistor for the collector to change from its on-state to its off-state, cannot be ignored. This characteristic, i.e. storage time, is of greater importance in switching applications, because it is generally many times longer than rise or fall time. While storage time decreases with increased collector current for a 200-amp transistor, the storage time was found to be still on the order of five to ten microseconds at 200 amps collector current. This storage time holds the transistor in the on-stage after the base drive is removed. During this time, the user has no control of the device. If an unfavorable condition, such as an overload or a shortcircuited collector load exists at this time, the collector current could rapidly rise to a high enough value to destroy the device.

Various circuits are used to reduce storage time by discharging or conducting the storage charges from the transistor base. These circuits range from simple resistors in the base to emitter connection to complex transistor active pull-down circuits and collector balancing inductors. Active pull-down circuits presently used do shorten the storage time considerably and are satisfactory for a single Darlington device or circuit. However, new problems surface when two or more Darlington devices are connected in parallel for switching higher currents. Since a pin-for-pin power connection of transistors gives the best efficiency in parallel operation, common bases require higher pull-down currents to maintain short storage times.

The present invention provides a method and circuit for parallel connection of Darlington devices providing very high current switching without the attendant disadvantages described above. The circuit as disclosed herein permits a pin-for-pin parallel connection of Darlington devices with no compensating components or resistors for balancing purposes. The circuit employs a plurality of active pull-down circuits which not only improve rise and fall times of the transistors in parallel operation, but also reduces the storage time to provide storage equalization by speeding up and synchronizing the turn-off time of the Darlington device. To accomplish this, an active pull-down circuit is connected to the common base connection for the drive circuit of the Darlington device to decrease the storage time. Further, an active pull-down circuit is connected to the emitter to base connection of each Darlington device to further speed up the discharge reducing the storage time to prevent back biasing the common base connection. Such back biasing can lead to oscillations resulting in damage or destruction of the Darlington devices. The active pull-down circuits are capacity coupled to an inverted drive signal from the drive source to synchronize the pull-down action with the turn-off of the Darlington device.

It is one object of the present invention to provide a method and circuit of parallel connecting of power transistors.

Yet another object of the present invention is to provide a circuit and method of parallel connection of a plurality of Darlington devices.

Still another object of the present invention is to provide a circuit and method for paralleling power transistors by reducing storage time.

Yet another object of the present invention is to provide a circuit and method to parallel the power transistors by use of a plurality of active pull-down circuits.

Yet another object of the present invention is to provide a circuit and method of parallel connecting a plurality of Darlington devices in which active pull-down circuits to reduce storage time and synchronize the turn-off time of the power transistors.

Other objects, advantages and novel features of the invention will become apparent from the following detailed description of the invention when considered in conjunction with the accompanying drawings wherein like reference numbers are identified by like parts throughout.

DETAILED DESCRIPTION OF THE PREFERRED EMBODIMENT

Figure 1:
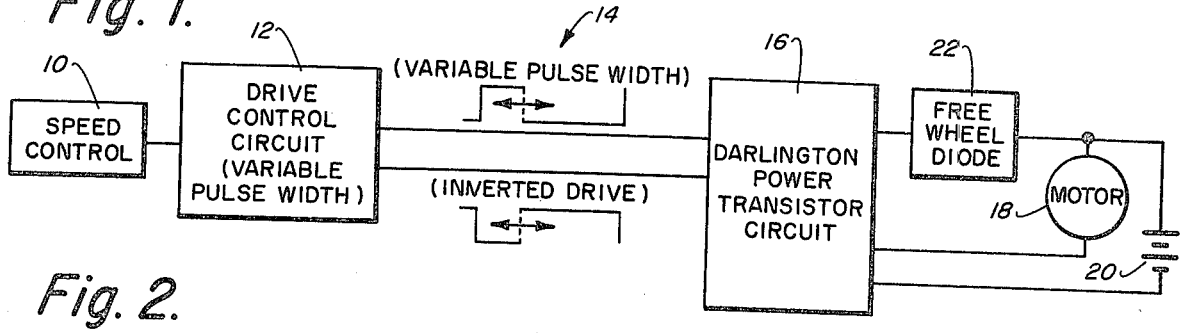
FIG. 1 is a functional block diagram of an electric vehicle motor controller employing a power switching Darlington device.

The present invention provides a method and circuit for parallel connection of two or more Darlington devices for use with electric vehicle controllers to provide very high current switching. The functional block diagram of FIG. 1 illustrates a circuit used in an electric vehicle motor controller. The circuit is comprised of a speed control 10 which can be an adjustable potentiometer for controlling the duty cycle of a drive control circuit 12 which produces the drive signal having the variable pulse width illustrated at 14. The pulse width of the pulse 14 is varied according to adjustment of the speed control and can be varied from a duty cycle of 0 to 100%. That is, the ratio of the on-time pulse to the entire pulse can be varied according to adjustment of the speed control. The pulse 14 from the drive control circuit switches the Darlington power transistor circuit or device 16 to operate the motor 18. A free-wheeling diode 22 functions during the off cycle of the power transistor circuit 16. Battery 20 is connected across the motor to the power transistor circuit.

Figure 2:
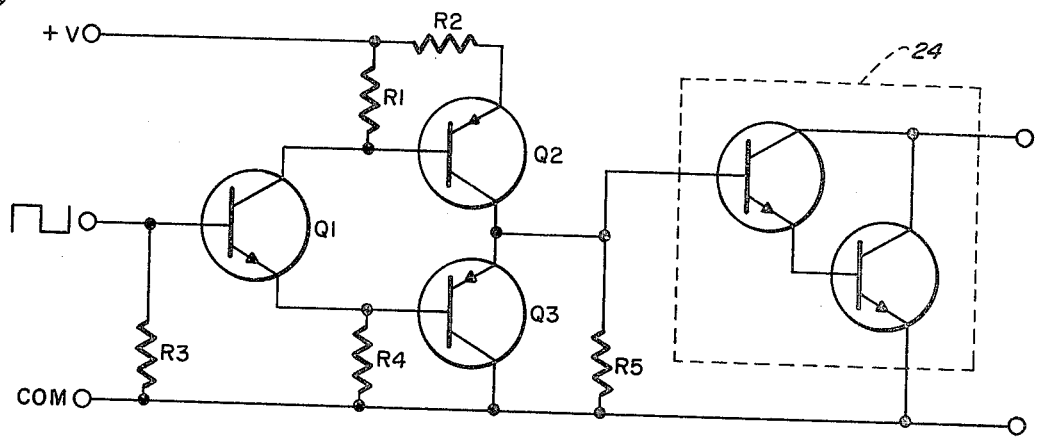
FIG. 2 is a schematic diagram of a power switching circuit having a single Darlington device.

For a single Darlington device, an active pull-down circuit is utilized as illustrated in FIG. 2. In FIG. 2 the drive circuit is connected to the input of transistor Q1 through switched current source Q2 to switch the Darlington device 24. Switching transistor Q1 operates the active pull-down circuit which makes use of both the NPN transistor Q3 and the resistor R5. This active pull-down circuit shortens the storage time sufficiently to be within the capability of a 200-amp Darlington device to stand normal overloads and adverse operating conditions seen in the field.

Figure 3:
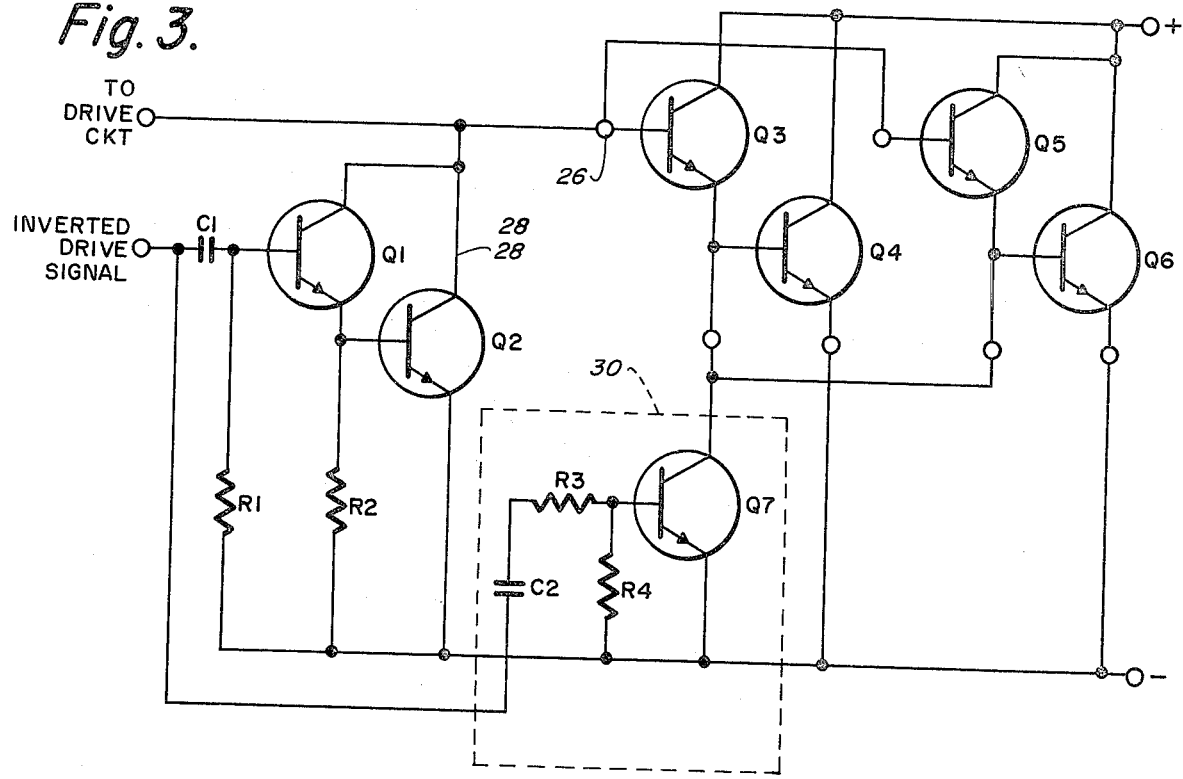
FIG. 3 is a schematic diagram of a power switching circuit with a plurality of parallel Darlington devices.

However, when a plurality of Darlington devices are connected, new problems arise. The common bases of parallel connected Darlington devices illustrated in FIG. 3 require higher pull-down currents to maintain short storage times. The capacity of the pull-down circuit in FIG. 1 is not sufficient to provide the required short storage time for operation with a plurality of parallel connected Darlington devices, as illustrated in FIG. 3. For this circuit it was discovered that additional active pull-down circuits as shown would solve the problem of reduced storage time. Thus, the active pull-down circuit of Q1 and Q2 connected to the common base connection 26 of the Darlington device substantially reduces the storage time and has the capacity to sustain the higher pull-down currents.

A small current pulse into transistor Q1 will give a large collector pulse on the output transistor Q2, or on the common collector lead 28, allowing the pull-down circuuit to handle more current with a smaller base current. The active pull-down circuit of Q1 and Q2 is coupled by capacitor C1 to an inverted drive signal which is the complement of the variable pulse width signal 14. Thus, the lagging or turn-off edge of the pulse 14 is the leading or turn-on pulse for the pull-down circuit of Q1 and Q2. The leading edge turns on transistor Q1 which in turn energizes or activates transistor Q2. The common collector lead 28 falls at the same time which effectively and rapidly pulls down the common base connection 26 of the parallel Darlington devices. The pull-down circuit of transistors Q1 and Q2 is only on for a short pulse, which is coincident with the turn-off of the entire power to the Darlington device power transistor because of the use of the inverted drive signal. Thus, this circuit actively switches the common base connection 26 of the Darlington device input transistor to ground to rapidly decrease the storage time, or conversely, speed up turn-off.

A significant unique feature of the invention, however, is the additional active pull-down circuit illustrated at 30. In this circuit a transistor Q7 is connected to the common emitter-base connection of each Darlington device Q3, Q4, Q5 and Q6, which effectively prevents back biasing of transistors Q3 and Q5 from emitter to base. This prevents the problems of oscillations which could destroy the Darlington devices. This active pull-down circuit is also coupled by a capacitor to the inverted drive signal so that the leading edge synchronizes turn-on of the additional pull-down circuit of Q7 with the turn-off of the Darlington devices. The capacitors coupling the inverted drive source to the pull-down circuits also prevent the storage time of the pull-down devices from causing turn-on delay in the power transistors. The active pull-down circuit 30 is coupled to the emitter-base connection of each Darlington device, but there could be individual pull-down circuits for each Darlington device, if desired.

The overall result of the active pull-down circuits connected as illustrated in FIG. 2 is a beneficial reduction of storage time in the Darlington devices, with the added benefits of decreased rise time and reliable operation of the parallel power transistors with no oscillations or instabilities. Typical results showed a reduction of storage time in the power transistors to less than approximately 0.5 microseconds and a reduction of rise time to less than 100 nanoseconds. While the circuit and method disclosed herein only shows two Darlington devices parallel connected, it should be obvious that a plurality of Darlington devices can be paralleled with this system. Further, the system can be used with Darlington circuits having both transistors on or on the same base.

Obviously, many modifications and variations are possible in light of the above teachings. It is therefore to be understood that the full scope of the invention is not limited to the details disclosed herein, but may be practiced otherwise than as specifically described.

What is claimed is:

1. A high-current switching transistor circuit comprising:
    a first Darlington device;
    at least one other Darlington device;
    said Darlington devices being connected in a parallel pin-for-pin configuration;
    drive source means for driving said Darlington devices said drive source means being directly connected to an input common base connection of all of said Darlington devices;
    first pull-down circuit means connected to said common base connection of the Darlington devices to reduce the storage time of power transistor in said Darlington devices;
    at least one other pull-down circuit means connected to a base to emitter connection in each Darlington device for synchronizing the turn-off times of said Darlington devices while further reducing the storage time of said power transistors.

2. The switching circuit according to claim 1 including:
    connecting means connecting said first pull-down circuit to said drive source means.

3. The switching circuit according to claim 2 wherein said connecting means comprises a capacitor.

4. The switching circuit according to claim 1 including:
    connecting means connecting all said pull-down circuit means to said drive source means.

5. The switching circuit according to claim 4 wherein said connecting means comprises a capacitor.

6. The switching circuit according to claim 5 wherein said first pull-down circuit comprises:
    a transistor connecting the common base of said Darlington devices to ground.

7. The switching circuit according to claim 6 wherein said other pull-down circuit comprises a transistor connecting all the emitter to base connections of said Darlington devices to ground.

8. A method for parallel connection of a plurality of high-current switching transistors connected as Darlington devices, comprising:
    connecting a plurality of said Darlington devices in a pin-for-pin parallel configuration;
    directly coupling an input base connection of all of said Darlington devices in a common base configuration;
    simultaneously discharging the commonly connected bases and base to emitter connections in said Darlington devices; and
    synchronizing the turn-off time of said Darlington devices.

9. The method according to claim 8 wherein the step of simultaneously discharging the commonly connected bases and the base to emitter connections of said Darlington devices comprises:
    connecting a first pull-down circuit to said commonly connected bases; and
    connecting a second pull-down circuit to all the base to emitter connections of said Darlington devices.

10. The method according to claim 9 wherein the step of synchronizing the turn-off time of said Darlington devices comprises:
    applying an inverted drive signal to said first and second pull-down circuits.

11. The method according to claim 8 wherein said step of synchronizing the turn-off time comprises:
    connecting a single discharge means to all the base to emitter connections of said Darlington devices;
    applying an inverted drive signal to said discharge means whereby the discharge and turn-off of said Darlington devices occur simultaneously.

* * * * *